United States Patent
Brüning et al.

(10) Patent No.: US 9,650,718 B2
(45) Date of Patent: May 16, 2017

(54) ELECTROLESS COPPER PLATING SOLUTION

(71) Applicant: ATOTECH DEUTSCHLAND GMBH, Berlin (DE)

(72) Inventors: Frank Brüning, Berlin (DE); Elisa Langhammer, Berlin (DE); Michael Merschky, Berlin (DE); Christian Lowinski, Berlin (DE); Jörg Schulze, Oranienburg (DE); Johannes Etzkorn, Berlin (DE); Birgit Beck, Berlin (DE)

(73) Assignee: ATOTECH DEUTSCHLAND GMBH, Berlin (DE)

( * ) Notice: Subject to any disclaimer, the term of this patent is extended or adjusted under 35 U.S.C. 154(b) by 34 days.

(21) Appl. No.: 14/779,866

(22) PCT Filed: Mar. 25, 2014

(86) PCT No.: PCT/EP2014/055962
§ 371 (c)(1),
(2) Date: Sep. 24, 2015

(87) PCT Pub. No.: WO2014/154689
PCT Pub. Date: Oct. 2, 2014

(65) Prior Publication Data
US 2016/0053379 A1 Feb. 25, 2016

(30) Foreign Application Priority Data

Mar. 27, 2013 (EP) .................................. 13161330

(51) Int. Cl.
| | | |
|---|---|---|
| C23C 18/40 | (2006.01) | |
| H01L 21/768 | (2006.01) | |
| H01L 23/532 | (2006.01) | |
| C23C 18/16 | (2006.01) | |

(52) U.S. Cl.
CPC .......... *C23C 18/40* (2013.01); *C23C 18/1639* (2013.01); *C23C 18/405* (2013.01); *H01L 21/76879* (2013.01); *H01L 23/53228* (2013.01); *H01L 2924/0002* (2013.01)

(58) Field of Classification Search
CPC .............. C23C 18/405; C23C 18/1639; C23C 18/1655; H01L 21/76879; H01L 23/53228
USPC .................... 106/1.23, 1.26; 427/99.5, 443.1
See application file for complete search history.

(56) References Cited

U.S. PATENT DOCUMENTS

| | | | |
|---|---|---|---|
| 4,209,331 A | | 6/1980 | Ferrier et al. |
| 4,303,443 A | * | 12/1981 | Miyazawa .............. C23C 18/40 106/1.23 |
| 4,617,205 A | * | 10/1986 | Darken .................. C23C 18/40 106/1.23 |
| 5,733,858 A | | 3/1998 | Wilson et al. |
| 5,738,914 A | * | 4/1998 | MacMillan ............. C23C 18/40 106/1.23 |
| 5,741,555 A | * | 4/1998 | Wilson .................... C23C 18/38 427/443.1 |
| 7,611,569 B2 | | 11/2009 | Poole et al. |
| 2002/0064592 A1 | * | 5/2002 | Datta ...................... C23C 18/40 427/443.1 |
| 2004/0154929 A1 | * | 8/2004 | Grunwald ............. C23C 18/405 205/291 |
| 2008/0038450 A1 | | 2/2008 | Poole et al. |
| 2008/0223253 A1 | * | 9/2008 | Song ....................... C23C 18/40 106/1.23 |
| 2009/0022885 A1 | | 1/2009 | Matsumoto et al. |
| 2014/0242264 A1 | * | 8/2014 | Stenhauser ............. C23C 18/40 427/99.5 |
| 2016/0273112 A1 | * | 9/2016 | Bruning .................. C23C 18/40 |

OTHER PUBLICATIONS

International Search Report for PCT/EP14/55962 mailed on May 9, 2014 (3 pages).
International Preliminary Report on Patentability for PCT/EP14/55962 mailed on Oct. 8, 2015 (6 pages).
English translation of Nov. 28, 2016, Office Action in corresponding Chinese Application No. 201480006909.6.

\* cited by examiner

*Primary Examiner* — Helene Klemanski
(74) *Attorney, Agent, or Firm* — Hunton & Williams LLP

(57) ABSTRACT

The invention relates to an electroless aqueous copper plating solution, comprising: a source of copper ions, a reducing agent or a source of a reducing agent, and a combination of complexing agents comprising i) polyamino disuccinic acid, polyamino monosuccinic acid, or a combination thereof, and ii) one or more of ethylenediamine tetraacetic acid, N'-(2-Hydroxyethyl)-ethylenediamine-N,N,N'-triacetic acid, and N,N,N',N'-Tetrakis (2-hydroxypropyl) ethylenediamine, as well as methods for electroless copper plating utilizing the solution and uses of the solution for the plating of various substrates.

19 Claims, 9 Drawing Sheets

ELECTROLESS COPPER PLATING SOLUTION

CROSS-REFERENCE TO RELATED APPLICATIONS

This application is the national phase application of International Patent Application Number PCT/EP2014/055962, filed Mar. 25, 2014 which claims the benefit of European Patent Application Number EP 13161330.9, filed Mar. 27, 2013. The contents of each of these applications is hereby incorporated by reference in their entireties.

The present invention relates to an electroless copper plating solution, a method for electroless copper plating utilizing said solution and the use of the solution for the plating of substrates.

Electroless plating is the controlled autocatalytic deposition of a continuous film of metal without the assistance of an external supply of electrons. Non-metallic surfaces may be pretreated to make them receptive or catalytic for deposition. All or selected portions of a surface may suitably be pretreated. The main components of electroless copper baths are the copper salt, a complexing agent, a reducing agent, and, as optional ingredients, an alkaline agent, and additives, as for example stabilizers. Complexing agents are used to chelate the copper to be deposited and prevent the copper from being precipitated from solution (i.e. as the hydroxide and the like). Chelating copper renders the copper available to the reducing agent which converts the copper ions to metallic form.

U.S. Pat. No. 4,617,205 discloses a composition for electroless deposition of copper, comprising copper ions, glyoxylate as reducing agent, and a complexing agent, for example EDTA, which is capable of forming a complex with copper that is stronger than a copper oxalate complex.

U.S. Pat. No. 7,220,296 teaches an electroless plating bath comprising a water soluble copper compound, glyoxylic acid and a complexing agent which may be EDTA.

US 20020064592 discloses an electroless bath comprising a source of copper ions, glyoxylic acid or formaldehyde as reducing agent, and EDTA, tartrate or alkanol amine as complexing agent.

US 20080223253 discloses an electroless copper plating solution including a copper salt, a reductant that may be selected from the group consisting of formaldehyde, paraformaldehyde, glyoxylic acid, $NaBH_4$, $KBH_4$, $NaH_2PO_2$, hydrazine, formalin, polysaccharide, such as glucose, and a mixture thereof, and a complexing agent which may be selected from the group consisting of ethylenediamine tetraacetic acid (EDTA), N'-(2-Hydroxyethyl)-ethylenediamine-N,N,N'-triacetic acid (HEDTA), cyclohexanediamine tetraacetic acid, diethylenetriamine pentaacetic acid, and N,N,N',N'-Tetrakis(2-hydroxypropyl)ethylenediamine (Quadrol).

Performance of a copper plating solution is difficult to predict and strongly depends on its constituents, especially the complexing agent and the reducing agent, and the molar ratio of its constituents.

An object of the invention was to provide with an electroless copper plating solution with improved performance, particularly an improved copper deposition rate.

The present invention provides with an electroless copper plating solution, comprising
 a source of copper ions,
 a reducing agent or a source of a reducing agent, and
 a combination comprising i) at least one polyamino disuccinic acid, or at least one polyamino monosuccinic acid, or a mixture of at least one polyamino disuccinic acid and at least one polyamino monosuccinic acid, and
ii) one or more of a compound which is selected from ethylenediamine tetraacetic acid, N'-(2-Hydroxyethyl)-ethylenediamine-N,N,N'-triacetic acid, and N,N,N',N'-Tetrakis(2-hydroxypropyl)ethylenediamine, as complexing agents, Ethylenediamine tetraacetic acid is hereinafter also named as "EDTA".

N'-(2-Hydroxyethyl)-ethylenediamine-N,N,N'-triacetic acid is hereinafter also named as "HEDTA".

N,N,N',N'-Tetrakis(2-hydroxypropyl)ethylenediamine is hereinafter also named as "Quadrol", which is a trademark of BASF company.

One or more of the above mentioned objects are achieved by the electroless copper plating solution (hereinafter abbreviated as the "solution") according to the above electroless copper plating solution, or by advantageous embodiments as described in dependent claims and the description. The copper plating solution of the invention shows an improved copper deposition rate. At the same time, a low roughness of copper surfaces can be reached, which is crucial for performance of certain electronic devices. Due to a higher deposition rate, a higher thickness of copper layer can be reached at the same process time.

The solution according to the invention and the process according to the invention are preferably used for the coating of printed circuit boards, chip carriers and semiconductor wafers or also of any other circuit carriers and interconnect devices. The solution is used in particular in printed circuit boards and chip carriers, but also in semiconductor wafers, to plate surfaces, trenches, blind micro vias, through hole vias (through holes) and similar structures with copper.

Particularly, the solution of the invention or the process of the invention can be used for deposition of copper on surfaces, in trenches, blind-micro-vias, through-hole-vias, and comparable structures in printed circuit boards, chips, carriers, wafers and various other interconnect devices. The term "through hole vias" or "through holes", as used in the present invention, encompasses all kinds of through hole vias and includes so-called "through silicon vias" in silicon wafers.

Another application wherein the solution can be used with beneficial effects is metallization of smooth, substrates made from glass, ceramic or plastics, preferably with a large surface area. Examples are any kind of displays, as for example any kind of TFT-displays and liquid crystal displays (LCD). As mentioned above, a low roughness of copper surfaces can be reached with the solution of the invention. This effect is advantageous particularly for display applications, since a copper layer having a low thickness, which means a thickness that is suitable for such applications, and having a good conductivity, can be produced. The roughness of a copper surface, produced with the solution of the invention, is preferably 5-40 nm, more preferably 10-30 nm, still more preferably 15-30 nm, expressed as root-mean-square roughness parameter (RMS). Explanation of the method for roughness measurement and the root-mean-square roughness parameter (RMS) is given in the examples. The invention in one aspect relates also to a copper-plated article, having a copper layer with a roughness of 5-40 nm, more preferably 10-30 nm, still more preferably 15-30 nm, expressed as root-mean-square roughness parameter (RMS).

The electroless copper plating solution of the invention can be beneficially used for deposition of copper on a glass substrate, particularly with large surface area, such as glass panels. Glass substrates are used, without limitation, for display applications, as mentioned above. Wet electroless copper deposition, with a solution as mentioned above, on a glass substrate is beneficial in comparison to metal sputtering processes that have been used so far. Benefits that can be reached with wet electroless deposition in comparison to sputtering techniques are, inter alia, reduced internal stress and reduced bending of a glass substrate, reduced equipment maintenance, effective use of metal, reduced material waste, reduced process temperature.

Anyhow, common wet electroless deposition usually produces rougher metal surfaces than sputtering processes. In the case of display production this causes poor switching properties, especially unfavorable prolonged switching times. Thus, for display production it is necessary to generate metal layers with a roughness in the range achieved by sputtering processes. Surprisingly the electroless copper plating solution of the invention is not only able to generate metal layers at higher deposition rate, but simultaneously with a low roughness in a range achieved by sputtering processes.

Moreover, substrates for display production are activated by metal seed layers for subsequent deposition of metal layers in order to build necessary circuitry and switching elements. Thus, the metal seed layers already display the future pattern of circuitry and switching elements that comprise small and/or isolated activated areas as well as a combination of small and larger activated areas. A high copper deposition rate on glass substrate is reached with the solution of the invention, especially on glass substrates that have these small and/or isolated activated areas. In addition the solution of the invention also is able to deposit metal layers with uniform thickness simultaneously onto small and larger activated areas at high deposition rates.

The solution of the invention is an aqueous solution. The term "aqueous solution" means that the prevailing liquid medium, which is the solvent in the solution, is water. Further liquids, that are miscible with water, as for example alcohols and other polar organic liquids, may be added.

The solution of the present invention may be prepared by dissolving all components in aqueous liquid medium, preferably in water.

The solution contains a copper ion source, which may for example be any water soluble copper salt. Copper may for example, and without limitation, be added as copper sulphate, copper chloride, copper nitrate, copper acetate, copper methane sulfonate ($(CH_3O_3S)_2Cu$), copper hydroxide; or hydrates thereof.

The reducing agent serves for reducing the copper ions in order to obtain metallic copper for plating. Reducing agents that can be employed are for example, and without limitation, formaldehyde, glyoxylic acid, hypophosphite, hydrazine, and borohydride. Preferred reducing agents are formaldehyde and glyoxylic acid.

The term "source of a reducing agent" means a substance that is converted to a reducing agent in the solution. The source is for example a precursor of a reducing agent that converted to the reducing agent. An example is given below with respect to glyoxylic acid.

A particularly preferred reducing agent is glyoxylic acid because of safety, health and environmental requirements. Even though formaldehyde is a very important and established reducing agent of the common electroless copper plating process, it was classified as a probable human carcinogen. Thus, the electroless aqueous copper plating solution in one embodiment comprises glyoxylic acid or a source of glyoxylic acid. In this embodiment, the solution of the invention does not contain formaldehyde, or, in other words, the solution is according to this embodiment free of formaldehyde.

The term "source of glyoxylic acid" encompasses all compounds that can be converted to glyoxylic acid in aqueous solution, such as precursors. A preferred precursor is dichloro acetic acid. Glyoxylic acid is the reducing agent for the reduction of copper ions to elementary copper. In the solution, glyoxylic acid and glyoxylate-ions may be present. As used herein the term "glyoxylic acid" includes salts thereof. The exact nature of the species, acid or salt, present will depend on the pH of the solution. The same consideration applies to other weak acids and bases.

In addition to one of the above-mentioned reducing agents, one or more additional reducing agents may be added, as for example hypophosphoric acid, glycolic acid or formic acid, or salts of aforementioned acids. The additional reducing agent is preferably an agent that acts as reducing agent but cannot be used as the sole reducing agent (cf. for example the disclosure in U.S. Pat. No. 7,220,296, col. 4, I. 20-43 and 54-62). Therefore, such additional reducing agent is in this sense also called an "enhancer".

Electroless copper baths using reducing agents described above preferably employ a relatively high pH, usually between 11 and 14, preferably between 12.5 and 13.5, and are adjusted generally by potassium hydroxide (KOH), sodium hydroxide (NaOH), lithium hydroxide (LiOH), ammonium hydroxide or quarternary ammonium hydroxide, such as tetramethylammonium hydroxide (TMAH). Thus, the solution may contain a source of hydroxide ions, as for example and without limitation one or more of the compounds listed above. A source of hydroxide is for example added if an alkaline pH of the solution is desired and if the pH is not already in the alkaline range by other constituents.

Especially preferred is the use of potassium hydroxide. Potassium hydroxide is of advantage, if glyoxylic acid is used as the reducing agent, because the solubility if potassium oxalate is high. Oxalate anions are formed in the solution by the oxidation of the glyoxylic acid. Thus, potassium hydroxide is especially preferable for stability of the solution of the present invention.

Polyamino disuccinic acids are compounds having two or more nitrogen atoms, wherein 2 of the nitrogens are bonded to a succinic acid (or salt) group, preferably only two nitrogen atoms each have one succinic acid (or salt) group attached thereto. As used herein the term succinic acid includes salts thereof. The compound has at least 2 nitrogen atoms, and due to the commercial availability of the amine, preferably has no more than about 10 nitrogen atoms, more preferably no more than about 6, most preferably 2 nitrogen atoms. Nitrogen atoms which do not have a succinic acid moiety attached most preferably are substituted with hydrogen atoms. More preferably, the succinic acid groups are on terminal nitrogen atoms, most preferably each of which nitrogens also have a hydrogen substituent. By terminal it is meant the first or last nitrogen atom which is present in the compound, irrespective of other substituents. Another definition of a terminal nitrogen is a primary amine nitrogen, before a succinic acid moiety is attached. The terminal nitrogen is transferred to a secondary amine nitrogen after a succinic acid moiety was attached. Because of steric hindrance of two succinic groups on one nitrogen, it is preferred that each nitrogen having a succinic group has only one such group. Remaining bonds on nitrogens having a succinic acid group are preferably filled by hydrogens or alkyl or alkylene groups (linear, branched or cyclic including cyclic structures joining more than one nitrogen atom or more than one bond of a single nitrogen atom, preferably linear) or such groups having ether or thioether linkages, all of preferably from 1 to 10 carbon atoms, more preferably from 1 to 6, most preferably from 1 to 3 carbon atoms, but most preferably hydrogen. More preferably, the nitrogen atoms are linked by alkylene groups, preferably each of from 2 to 12 carbon atoms, more preferably from 2 to 10 carbon atoms, even more preferably from 2 to 8, most preferably from 2 to 6 carbon atoms, namely ethylene, propylene, butylene, pentylene or hexylene. The polyamino disuccinic acid compound preferably has at least about 10 carbon atoms and preferably has at most about 50, more preferably at most about 40, most preferably at most about 30 carbon atoms. The term "succinic acid" is used herein for the acid and salts thereof; the salts include metal cation (e.g. potassium, sodium) and ammonium or amine salts.

Polyamino disuccinic acids useful in the practice of the invention are unsubstituted (preferably) or inertly substituted, that is substituted with groups that do not undesirably interfere with the activity of the polyamino disuccinic acid in a selected application. Such inert substituents include alkyl groups (preferably of from 1 to 6 carbon atoms); aryl groups including arylalkyl and alkylaryl groups (preferably of from 6 to 12 carbon atoms), with alkyl groups preferred among these and methyl and ethyl groups preferred among alkyl groups.

Inert substituents are suitably on any portion of the molecule, preferably on carbon atoms, more preferably on alkylene groups, for example alkylene groups between nitrogen atoms or between carboxylic acid groups, most preferably on alkylene groups between nitrogen groups.

Preferred polyamino disuccinic acids include ethylenediamine-N,N'-disuccinic acid (EDDS), diethylenetriamine-N,N''-disuccinic acid, triethylenetetraamine-N,N'''-disuccinic acid, 1,6 hexamethylenediamine N,N'-disuccinic acid, tetraethylenepentamine-N,N''''-disuccinic acid, 2-hydroxypropylene-1,3-diamine-N,N'-disuccinic acid, 1,2 propylenediamine-N,N'-disuccinic acid, 1,3-propylenediamine-N,N''-disuccinic acid, cis-cyclohexanediamine-N,N'-disuccinic acid, transcyclohexanediamine-N,N'-disuccinic acid, and ethylenebis(oxyethylenenitrilo)-N,N'-disuccinic acid. The preferred polyamino disuccinic acid is ethylenediamine-N,N'-disuccinic acid.

Such polyamino disuccinic acids can be prepared, for instance, by the process disclosed by Kezerian et al. in U.S. Pat. No. 3,158,635 which is incorporated herein by reference in its entirety. Kezerian et al disclose reacting maleic anhydride (or ester or salt) with a polyamine corresponding to the desired polyamino disuccinic acid under alkaline conditions. The reaction yields a number of optical isomers, for example, the reaction of ethylenediamine with maleic anhydride yields a mixture of three optical isomers [R,R], [S,S] and [S,R] ethylenediamine disuccinic acid (EDDS) because there are two asymmetric carbon atoms in ethylenediamine disuccinic acid. These mixtures are used as mixtures or alternatively separated by means within the state of the art to obtain the desired isomer(s). Alternatively, [S,S] isomers are prepared by reaction of such acids as L-aspartic acid with such compounds as 1,2-dibromoethane as described by Neal and Rose, "Stereospecific Ligands and Their Complexes of Ethylenediaminedisuccinic Acid", Inorganic Chemistry, V. 7, (1968), pp. 2405-2412.

Polyamino monosuccinic acids are compounds having at least two nitrogen atoms to which a succinic acid (or salt) moiety is attached to one of the nitrogen atoms. Preferably the compound has at least 2 nitrogen atoms, and due to the commercial availability of the amine, preferably has no more than about 10 nitrogen atoms, more preferably no more than about 6, most preferably 2 nitrogen atoms. Remaining nitrogen atoms, those which do not have a succinic acid moiety attached, preferably are substituted with hydrogen atoms. Although the succinic acid moiety may be attached to any of the amines, preferably the succinic acid group is attached to a terminal nitrogen atom. By terminal it is meant the first or last amine which is present in the compound, irrespective of other substituents. Another definition of a terminal nitrogen is a primary amine nitrogen, before a succinic acid moiety is attached. The terminal nitrogen is transferred to a secondary amine nitrogen after a succinic acid moiety was attached. The remaining bonds on the nitrogen having a succinic acid group are preferably filled by hydrogens or alkyl or alkylene groups (linear, branched or cyclic including cyclic structures joining more than one nitrogen atom or more than one bond of a single nitrogen atom, preferably linear) or such groups having ether or thioether linkages, all of preferably from 1 to 10 carbon atoms, more preferably from 1 to 6, most preferably from 1 to 3 carbon atoms, but most preferably hydrogen. Generally the nitrogen atoms are linked by alkylene groups, each of from 2 to 12 carbon atoms, preferably from 2 to 10 carbon atoms, more preferably from 2 to 8, and most preferably from 2 to 6 carbon atoms, namely ethylene, propylene, butylene, pentylene or hexylene. The polyamino monosuccinic acid compound preferably has at least about 6 carbon atoms and preferably has at most about 50, more preferably at most about 40, and most preferably at most about 30 carbon atoms. Polyamino monosuccinic acids useful in the practice of the invention are unsubstituted (preferably) or inertly substituted as described above for polyamino disuccinic acid compounds.

Preferred polyamino monosuccinic acids include ethylenediamine monosuccinic acid, diethylenetriamine monosuccinic acid, triethylenetetraamine monosuccinic acid, 1,6-hexamethylenediamine monosuccinic acid, tetraethylenepentamine monosuccinic acid, 2 hydroxypropylene-1,3-diamine monosuccinic acid, 1,2-propylenediamine monosuccinic acid, 1,3-propylenediamine monosuccinic acid, ciscyclohexanediamine monosuccinic acid, transcyclohexanediamine monosuccinic acid and ethylenebis(oxyethylenenitrilo) monosuccinic acid. The preferred polyamino monosuccinic acid is ethylenediamine monosuccinic acid.

Such polyamino monosuccinic acids can be prepared for instance, by the process of Bersworth et al. in U.S. Pat. No. 2,761,874, the disclosure of which is incorporated herein by reference, and as disclosed in Jpn. Kokai Tokkyo Koho JP 57,116,031. In general, Bersworth et al. disclose reacting alkylene diamines and dialkylene triamines under mild conditions with maleic acid esters under mild conditions (in an alcohol) to yield amino derivatives of N-alkyl substituted aspartic acid. The reaction yields a mixture of the R and S isomers.

In one embodiment, when the solution contains a mixture of a polyamino disuccinic acid and a polyamino monosuccinic acid, it is preferred that the polyamino substituent of the polyamino disuccinic acid and the polyamino monosuccinic acid are the same. Thus by way of example, if the polyamino disuccinic acid is ethylenediamine-N,N'-disuccinic acid, the polyamine monosuccinic acid is ethylenediamine monosuccinic acid.

In a preferred embodiment, ethylenediamine-N,N'-disuccinic acid (EDDS) is used as complexing agent. EDDS is a preferred complexing agent because of its high biodegradability. EDDS is moreover preferred because a very efficient increase in copper deposition rates can be reached. This effect is also observed when other complexing agents, in addition to EDDS, are present in the bath. Before the present invention was made, it has been observed that increase of metal deposition rate leads to increased roughness of metal surfaces. In the present invention a high copper deposition rate and a copper surface with low roughness are obtained.

The increase in deposition rate is proportional to the concentration of polyamino disuccinic acid and/or polyamino monosuccinic acid in the bath, particularly in case of EDDS. Thus, the deposition rate can be controlled by concentration of polyamino disuccinic acid and/or polyamino monosuccinic acid. This allows an easier integration of the electroless copper deposition process in already existing processes for manufacture of printed circuit boards (PCB) or displays, and an easier adaptation to already existing production plants and their technique.

The solution of the present invention is free of toxic co-metals. The solution of the present invention is especially free of nickel. Nickel forms a more stable complex with the complexing agents used herein than copper. It therefore reduces copper complexation and negatively affects or impedes copper deposition. Moreover, the presence of nickel in the bath would lead to unwanted nickel deposition, which has to be avoided especially in display production.

The term "EDDS" includes racemic EDDS or optically active isomers thereof, such as (S,S)-EDDS, and salts and derivatives thereof. Preferably the term means (S,S)-EDDS or salts thereof. EDDS may be prepared by the process of PCT/GB94/02397. In the solution, ethylenediaminedisuccinic acid and ethylenediaminedisuccinate-ions may be present, depending on the pH of the solution.

In one embodiment of a solution of the present invention, the molar ratio of the complexing agents, related to the total molar amount of all complexing agents, to copper ions is in the range of 1:1 to 10:1, preferably 1:1 to 8:1, more preferably 2:1 to 8:1, more preferably 2:1 to 5:1, even more preferably 2:1 to 4:1. In the examples the amount of complexing agents is also given as equivalents. One equivalent is the amount of a complexing agent which completely complexes a given amount of copper ions. In the case of EDDS, EDTA, HEDTA and Quadrol one equivalent of complexing agent corresponds to a molar ratio of complexing agent to copper ions of 1:1. In the case of EDDS, EDTA, HEDTA and Quadrol a molar ratio of 1:1 to 10:1 of complexing agent(s) to copper ions means 1 to 10 equivalents of complexing agent(s) related to copper.

Less complexing agent leads to instability of the bath or deposition does not start. More complexing agent in relation to copper leads to a high density of the bath, which also leads to reduced lifetime and instability of the bath. Using these ranges leads to a beneficial combination of high copper deposition rate and low roughness.

In another embodiment, the molar ratio of the complexing agents, which means the total amount of all complexing agents, to copper ions is in the range of 3:1 to 8:1, more preferably 3:1 to 5:1, even more preferably 3:1 to 4:1. Using these ranges leads to a particularly beneficial combination of high copper deposition rate and low roughness. A very reproducible performance, a very reproducible copper deposition, and copper layers with very uniform thickness can be obtained.

In one embodiment, the molar ratio of complexing agent i) to complexing agent(s) ii), related to the total molar amount of all complexing agent(s) ii), ranges from 1:0.1 to 1:30, 1:0.5 to 1:25, 1:1 to 1:20, preferably from 1:1 to 1:15, more preferably from 1:1 to 1:10 and most preferably from 1:1 to 1:8. Using these ranges leads to a beneficial combination of high copper deposition rate and low roughness.

A specific combination of complexing agents is a combination comprising
i) at least one polyamino disuccinic acid, or at least one polyamino monosuccinic acid, or a mixture of at least one polyamino disuccinic acid and at least one polyamino monosuccinic acid, and
ii) N'-(2-Hydroxyethyl)-ethylenediamine-N,N,N'-triacetic acid (HEDTA), A further specific combination of complexing agents is a combination comprising
i) at least one polyamino disuccinic acid, or at least one polyamino monosuccinic acid, or a mixture of at least one polyamino disuccinic acid and at least one polyamino monosuccinic acid, and
ii) ethylenediamine tetraacetic acid (EDTA).

A further specific combination of complexing agents is a combination comprising
i) at least one polyamino disuccinic acid, or at least one polyamino monosuccinic acid, or a mixture of at least one polyamino disuccinic acid and at least one polyamino monosuccinic acid, and
ii) N,N,N',N'-Tetrakis(2-hydroxypropyl)ethylenediamine (Quadrol)

In one embodiment, the electroless aqueous copper plating solution comprises, as complexing agents, a combination comprising
i) at least one polyamino disuccinic acid, or at least one polyamino monosuccinic acid, or a mixture of at least one polyamino disuccinic acid and at least one polyamino monosuccinic acid, and
ii) N'-(2-Hydroxyethyl)-ethylenediamine-N,N,N'-triacetic acid (HEDTA), and
iii) N,N,N',N'-Tetrakis(2-hydroxypropyl)ethylenediamine (Quadrol).

In a further embodiment, the electroless aqueous copper plating solution comprises, as complexing agents, a combination comprising
i) at least one polyamino disuccinic acid, or at least one polyamino monosuccinic acid, or a mixture of at least one polyamino disuccinic acid and at least one polyamino monosuccinic acid, and
ii) N'-(2-Hydroxyethyl)-ethylenediamine-N,N,N'-triacetic acid (HEDTA), and
iii) ethylenediamine tetraacetic acid (EDTA)

In a still further embodiment, the electroless aqueous copper plating solution comprises, as complexing agents, a combination comprising
i) at least one polyamino disuccinic acid, or at least one polyamino monosuccinic acid, or a mixture of at least one polyamino disuccinic acid and at least one polyamino monosuccinic acid, and
ii) N,N,N',N'-Tetrakis(2-hydroxypropyl)ethylenediamine (Quadrol), and
iii) ethylenediamine tetraacetic acid (EDTA)

In a still further embodiment, at least one polyamino disuccinic acid, or at least one polyamino monosuccinic acid, or a mixture of at least one polyamino disuccinic acid and at least one polyamino monosuccinic acid (component i) is combined with EDTA, HEDTA and Quadrol.

A beneficial complexing agent i), in all embodiments, is EDDS.

The solution of the invention in one embodiment contains following kinds of ingredients in following concentrations:

Copper ions: 1-5 g/l, corresponding to 0.016-0.079 mol/l, preferably 2.0-3.0 g/l Reducing agent: 0.027-0.270 mol/l, preferably glyoxylic acid: 2-20 g/l, or formaldehyde: 0.8-8.5 g/l.

Complexing agents (total amount of all complexing agents): 5-50 g/l, more preferably 20-40 g/l.

The solution of the present invention may comprise—and does not necessarily comprise—further components, as for example stabilizers, surfactants, additives, as rate controlling additives, grain refining additives, pH buffers, pH adjusters, and enhancers. Such further components are for example described in following documents, which are incorporated by reference in their entirety: U.S. Pat. No. 4,617,205 (particularly disclosure in col. 6, I. 17—col. 7, I. 25), U.S. Pat. No. 7,220,296 (particularly col. 4, I. 63—col. 6, I. 26), US 2008/0223253 (cf. particularly paragraphs 0033 and 0038).

Stabilizing agents, also referred to as stabilizers, are compounds that stabilize the electroless plating solution against unwanted outplating in the bulk solution. The term "outplating" means unwanted and/or uncontrolled deposition of copper, for example on the bottom of a reaction vessel or on other surfaces. Stabilizing function can for example be accomplished by substances acting as catalyst poison (for example sulfur or other chalcogenide containing compounds) or by substances forming copper(I)-complexes, thus inhibiting the formation of copper(I)oxide.

Suitable stabilizers are, without limitation, dipyridyls (2,2'-dipyridyl, 4,4'dipyridyl), phenanthroline, mercaptobenzothiazole, thio-urea or its derivatives, cyanides like NaCN, KCN, $K_4[Fe(CN)_6]$, $Na_2S_2O_3$, $K_2S_2O_3$, thiocyanates, iodides, ethanolamines, polymers like polyacrylamides, polyacrylates, polyethylene glycols, or polypropylene glycols and their co-polymers.

In another aspect, the present invention relates to a process for electroless copper plating, the process comprising contacting a substrate with an electroless copper plating solution as described above. In the process, a copper layer is formed on the substrate, preferably with a roughness of 5-40 nm, expressed as root-mean-square roughness parameter (RMS).

For example, the substrate may be dipped or immersed in the solution of the invention. In the process a whole surface of a substrate may be plated with copper, or only selected portions.

It is preferred that the solution be agitated during use. In particular, work- and/or solution-agitation may be used.

The process will be carried out for a sufficient time to yield a deposit of the thickness required, which in turn will depend on the particular application.

One envisaged application of the process is the preparation of printed circuit boards. The electroless deposition of copper according to the process of the invention can particularly be used for the through-plating of holes, surfaces, trenches, blind micro vias in printed circuit boards. Double sided or multilayer boards (rigid or flexible) may be plated by means of the present invention.

The process of the invention may be useful in providing electroless copper deposits with a thickness in the range of 0.05 to 10 μm. Thickness of copper layer is determined with white light interferometry, as described in the examples.

Substrates that are generally used for printed circuit board manufacture are most frequently epoxy resins or epoxy glass composites. But other substances, notably phenolic resins, polytetrafluoroethylene (PTFE), polyimides polyphenyleneoxides, BT (bismaleintriazine)-resins, cyanate esters and polysulphones can be used.

Aside from the application of the process in the production of printed circuit boards, it may be found to be useful in plating substrates made from glass, ceramic or plastics, as for example ABS, polycarbonate, polyimide or polyethylene terephthalate.

In another embodiment of the process, the substrate is a substrate made from glass, ceramic or plastics, preferably with a large surface area. A large surface area means preferably an area of at least one $m^2$, more preferably at least 3 $m^2$, still more preferably at least 5 $m^2$. A large surface area means in another embodiment preferably an area of 1 $m^2$ to 9 $m^2$, more preferably 3 $m^2$ to 9 $m^2$, still more preferably 5 $m^2$ to 9 $m^2$. The substrate has preferably a smooth surface. The term smooth means preferably a roughness (Sq or RMS) of a few nanometers. Preferably the roughness is 5-30 nm, expressed as root-mean-square roughness parameter (RMS). Explanations of the method for roughness measurement and of "Sq" and "RMS" are given in the examples.

In a special embodiment, the substrate is a glass substrate, preferably a glass panel. Said glass substrates, especially glass panels can be used for application in TFT displays, such as liquid crystal displays. Thus, the glass substrate is particularly such one that fulfils the specifications as used in display production, as for example thickness and smoothness. A preferred glass is free from alkali, such as alkali free boro-silicate-glass.

Glass substrates may be pretreated before the process of the invention is carried out, for example with metal seeds, as further explained below.

In one embodiment of the process of the present invention, the process is carried out at a temperature in the range of 20-60° C., preferably 30-55° C. It has been shown in the present invention that when at least one polyamino disuccinic acid, or at least one polyamino monosuccinic acid, or a mixture of at least one polyamino disuccinic acid and at least one polyamino monosuccinic acid, particularly EDDS, is used as complexing agent, in combination with another complexing agent, copper deposition can be done at lower temperatures than in absence of this component. Even though the temperature is lower, the deposition rate is higher than with a bath that does not contain at least one polyamino disuccinic acid, or at least one polyamino monosuccinic acid, or a mixture of at least one polyamino disuccinic acid and at least one polyamino monosuccinic acid, particularly EDDS.

The substrate, i.e. the surfaces of the substrate that are to be plated with copper, particularly non-metallic surfaces, may be pretreated by means within the skill in the art (as for example described in U.S. Pat. No. 4,617,205, col 8) to make it/them more receptive or autocatalytic for copper deposition. All or selected portions of a surface may be pretreated. A pretreatment is, however, not necessary in every case and depends on the kind of substrate and surface. Within the pretreatment, it is possible to sensitise substrates prior to the deposition of electroless copper on them. This may be achieved by the adsorption of a catalysing metal (such as a noble metal, for example palladium) onto the surface of the substrate.

A pretreatment process strongly depends on parameters as the substrate, the desired application, and the desired properties of the copper surface.

An exemplary and non-limiting pretreatment process, especially for printing circuit board laminates and other suitable substrates, may comprise one or more of the following steps a) optionally cleaning and conditioning the substrate to increase adsorption. With a cleaner, organics and other residues are removed. It may also contain additional substances (conditioners) that prepare the surface for the following activation steps, i.e. enhance the adsorption of the catalyst and lead to a more uniformly activated surface,
   b) etching, to remove oxides from the surface of the copper, especially from inner layers in holes. This may be done by persulphate or peroxide based etching systems,
   c) contacting with a pre-dip solution, such as a hydrochloric acid solution or sulfuric acid solution, optionally with an alkali metal salt, such as sodium chloride, also in the pre-dip solution,
   d) contacting with an activator solution, that contains colloidal or ionic catalysing metal, such as a noble metal, preferably palladium, causing the surface to become catalytic.
      The pre-dip in step c) serves to protect the activator from drag-in and contaminations, and optionally, particularly if the activator contains ionic catalysing metal,
   e) contacting with a reducer, wherein the metal ions of an ionic activator are reduced to elemental metal.
      or, if the activator contains colloidal catalysing metal,
   f) contacting with an accelerator, wherein components of the colloid, for example a protective colloid, is removed from the catalysing metal.

In another kind of pretreatment process a permanganate etching step is employed. The so-called Desmear process is a multi-stage process, the steps of which are a swelling step, a permanganate etching step and a reduction step. The sweller used in the swelling step is made of a mixture of organic solvents. During this step drill smear and other impurities are removed from the surfaces of the substrate. A high temperature of 60-80° C. promotes the infiltration of the sweller which leads to a swelled surface. Therefore a stronger attack of the subsequently applied permanganate solution is possible during the permanganate etching step. Afterwards the reduction solution of the reduction step removes the manganese dioxides produced during the permanganate step from the surfaces. The reduction solution contains a reducing agent and optionally a conditioner.

The desmear process may be combined with the above described steps. The desmear process may be performed before step a) of the above described pretreatment process or the desmear process may be performed instead of steps a) and b) of the above described pretreatment process.

In a pretreatment process which is particularly suitable in metallization for display applications and in metallization of glass substrates, a surface is only contacted with a pre-dip solution and an activator solution and then with the solution of the invention. Contacting with a cleaning solution and an adhesion enhancer before the pre-dip step are optional steps that can be carried out in advance.

Still another process, which is often used for glass substrates, may be carried out with following steps before copper plating: A glass surface that is to be plated exhibits metal seed layers. The metal seed layers may be brought onto the surface by sputtering techniques. Exemplary seeds are layers composed of copper, molybdenum, titanium or a mixture thereof. Said pretreated glass surface is contacted with an activator solution that contains ionic catalysing metal, such as a noble metal, preferably palladium, causing the surface to become catalytic. The ionic catalysing metal is reduced onto the surface by the seed metal. In this process, addition of a further reducer may be omitted. This process is especially used in copper plating of glass substrates for display applications.

The exemplary pretreatment processes, or single steps thereof, may be combined to alternative pretreatment processes, if found necessary.

In a further aspect, the present invention relates to the use of the electroless copper plating solution as described above for the plating of printed circuit boards, wafers, Integrated circuit substrates, molded interconnect device (MID) components, displays, such as liquid crystal or plasma displays, particularly displays for electronic devices or TVs, display components, or plastic parts, such as plastic parts for functional or decorative purposes.

Figure 1:
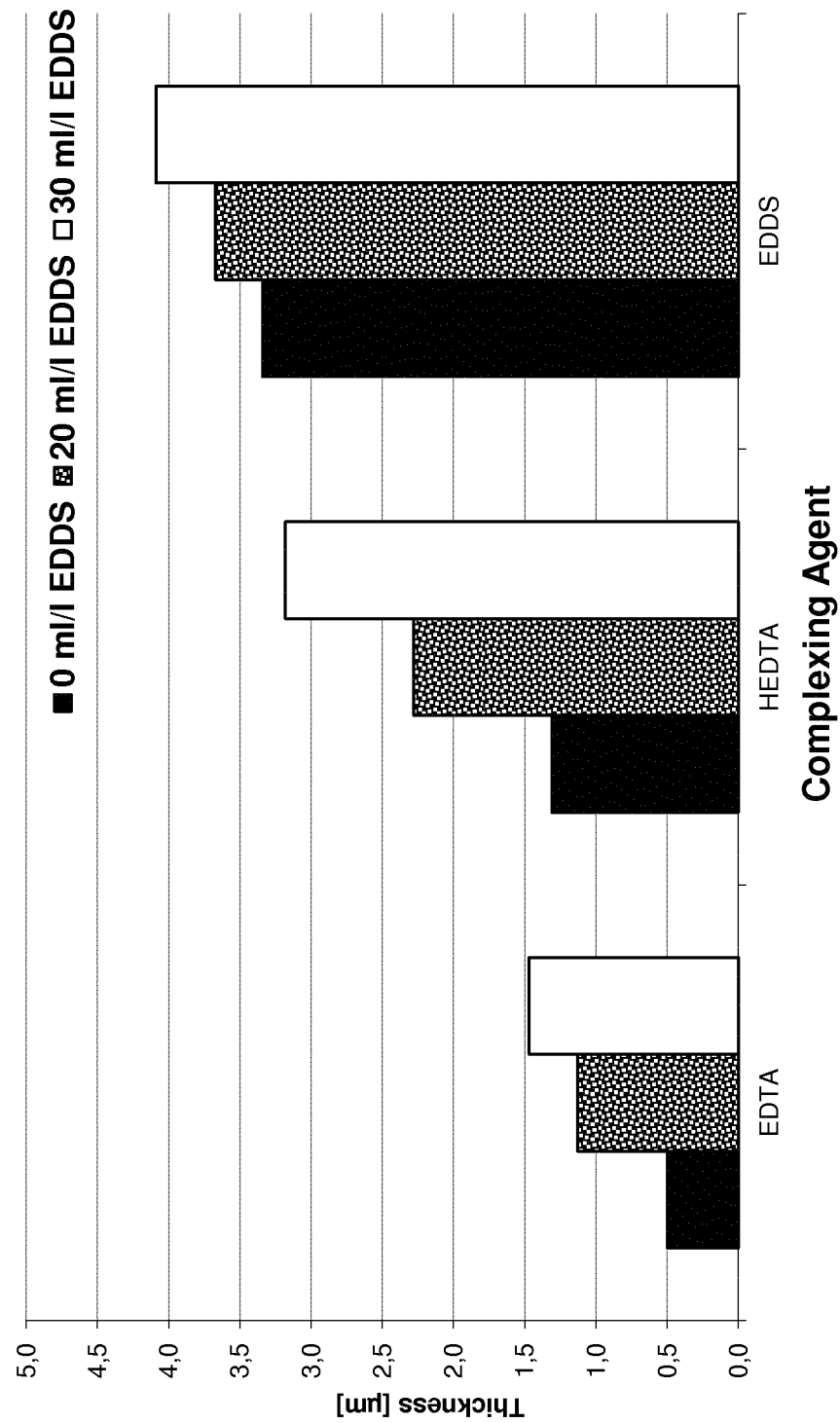
FIG. 1 effect of a combination of polyamino disuccinic acid with one further complexing agent on copper thickness in a plating process FIG. 2a-c Combination of polyamino disuccinic acid with two further complexing agents; effect of polyamino disuccinic acid addition on copper deposition rate and roughness of copper layer in a plating process FIG. 3 Beaker test, combination of polyamino disuccinic acid with two further complexing agents; effect of polyamino disuccinic acid addition on copper deposition rate of copper in a plating process FIG. 4 Horizontal line experiment, combination of polyamino disuccinic acid with two further complexing agents; effect of polyamino disuccinic acid addition on copper deposition rate of copper in a plating process FIG. 5 Comparative Example, effect of varying amounts of two other complexing agents, without addition of polyamino disuccinic acid FIG. 6 Results of the variation of the ratio of two complexing agents FIG. 7 Results of the variation of the ratio of copper to total complexing agents The invention is now described in further detail by the following examples. These examples are set forth to illustrate the present invention, but should not be construed as limiting the present invention.

Method of Roughness Measurement:

An Optical profilometer/White light interferometer, Model MIC-520, of ATOS GmbH (Germany) was used to measure the thickness (Height difference between base plane and plated pattern) and surface roughness of electrolessly plated copper layers. White light interferometry is an optical microscopy method known to persons skilled in the art which projects the target area of a sample onto a CCD camera. Using interference objectives equipped with an internal beam splitter, a high-precision reference mirror is projected onto the CCD camera as well. Due to the overlay of both images, a spatially resolved interferogram is created which reflects the height differences between the very flat reference mirror and the sample of interest. In order to image samples with large height distribution a vertical scan scheme is used, i.e. interferograms of the area of interest are imaged as a series within a range of different sample-objective distances. From these data a full three dimensional image is compiled. Using this method topographic images in the range of 60 µm×60 µm to 1.2 mm×1.2 mm can be recorded with a vertical resolution in the range of a few nm.

The topographic data are used to calculate surface roughness expressed as the root-mean-square roughness parameter, abbreviated as Rq or RMS on surface profiles (profile roughness parameter) and abbreviated as Sq on surface topographies (areal roughness parameter). The meaning of Rq is identical to the meaning of RMS. Rq, or RMS, has the meaning as defined in DIN EN ISO 4287 (German and English version of 1998, Chapter 4.2.2) and Sq has the meaning as defined in ISO 25178-2 of April 2012 (Chapter 4.1.1).

In addition the topographic data are used to calculate the thickness of the plated copper layers as height difference between the substrate surface (base plane) and the surface of the plated metal pattern. For calculating topographic images, layer thickness and surface roughness the Optical profilometer/White light interferometer, Model MIC-520, of ATOS GmbH (Germany) was equipped with the computer software Micromap 123, version 4.0, by Micromap Corporation.

The mode of measurement was Focus 560 M. The topographic images were measured with an objective lens with 10 times magnification and an ocular with 2 times magnification. The topographic images were recorded in the range of 312 µm×312 µm and consist of 480×480 points.

EXAMPLE 1

Combination of Polyamino Disuccinic Acid with a Further Complexing Agent

Substrate: Alkali-Free Borosilicate Glass, Thickness 0.7 mm, Sputtered Seed Layer of Copper.
Pre Treatment:
1. alkaline cleaner 40° C./1 min
2. rinsing with $H_2O$
3. sulfuric acid pre dip solution, room temperature (RT)/20 sec
4. ionic Pd-activator (exchange-reaction between Cu and Pd) RT/2 min
5. rinsing with $H_2O$ Electroless copper plating solutions were manufactured. As complexing agents combinations of EDDS/EDTA, and EDDS/HEDTA were employed. EDDS was added in amounts of 0 g/l, 4.5 g/l and 6.8 g/l, respectively. $Cu2_+$ ions were added as $CuSO_4*6H_2O$, the enhancer $H2PO2^-$ was added as Na $H2PO2*2H2O$, and as stabilizer a mixture of cyanide and sulphur compounds was added. The pH of the baths were 13.2 at 21° C.

EDDS as only complexing agent, in different amounts, was employed as comparative example.

Substrates were contacted with the respective plating solutions as described above at 55° C. for 10 min each. The samples of deposited Cu layers were analysed according to the described method in measuring mode "Focus 560 M". The results are shown in the following tables 1 to 4. FIG. 1 shows a chart of the results obtained.

TABLE 1

Combination of EDDS/EDTA

|  | 0 ml/l EDDS (comp.) | 20 ml/l EDDS | 30 ml/l EDDS |
|---|---|---|---|
| EDTA | 23.1 g/l | 23.1 g/l | 23.1 g/l |
| EDTA in Equivalents | 2.0 | 2.0 | 2.0 |

TABLE 1-continued

Combination of EDDS/EDTA

|  | 0 ml/l EDDS (comp.) | 20 ml/l EDDS | 30 ml/l EDDS |
|---|---|---|---|
| $Cu^{2+}$ | 2.5 g/l | 2.5 g/l | 2.5 g/l |
| $H_2PO_2^-$ | 9.1 g/l | 9.1 g/l | 9.1 g/l |
| KOH | 10 g/l | 10 g/l | 10 g/l |
| Glyoxylic Acid | 4.5 g/l | 4.5 g/l | 4.5 g/l |
| Stabilizer | 10 mg/l | 10 mg/l | 10 mg/l |
| EDDS | 0 g/l | 4.5 g/l | 6.8 g/l |
| EDDS in Equivalents | 0 | 0.4 | 0.6 |
| Temperature [° C.] | 55 | 55 | 55 |
| Cu thickness [µm] | 0.50 | 1.13 | 1.47 |

TABLE 3

Combination of EDDS/HEDTA

|  | 0 ml/l EDDS (comp.) | 20 ml/l EDDS | 30 ml/l EDDS |
|---|---|---|---|
| HEDTA | 22.1 g/l | 22.1 g/l | 22.1 g/l |
| HEDTA in Equivalents | 2.0 | 2.0 | 2.0 |
| $Cu^{2+}$ | 2.5 g/l | 2.5 g/l | 2.5 g/l |
| $H_2PO_2^-$ | 9.1 g/l | 9.1 g/l | 9.1 g/l |
| KOH | 10 g/l | 10 g/l | 10 g/l |
| Glyoxylic Acid | 4.5 g/l | 4.5 g/l | 4.5 g/l |
| Stabilizer | 10 mg/l | 10 mg/l | 10 mg/l |
| EDDS | 0 g/l | 4.5 g/l | 6.8 g/l |
| EDDS in Equivalents | 0 | 0.4 | 0.6 |
| Temperature [° C.] | 55 | 55 | 55 |
| Cu thickness [µm] | 1.31 | 2.28 | 3.18 |

TABLE 4

Comparative Example, only EDDS in different amounts

|  | Comp. Example | | |
|---|---|---|---|
|  | 0 ml/l EDDS (comp.) | 20 ml/l EDDS | 30 ml/l EDDS |
| EDDS | 28.4 g/l | 28.4 g/l | 28.4 g/l |
| EDDS in Equivalents | 2.0 | 2.0 | 2.0 |
| $Cu^{2+}$ | 2.5 g/l | 2.5 g/l | 2.5 g/l |
| $H_2PO_2^-$ | 9.1 g/l | 9.1 g/l | 9.1 g/l |
| KOH | 10 g/l | 10 g/l | 10 g/l |
| Glyoxylic Acid | 4.5 g/l | 4.5 g/l | 4.5 g/l |
| Stabilizer | 10 mg/l | 10 mg/l | 10 mg/l |
| EDDS | 0 g/l | 4.5 g/l | 6.8 g/l |
| EDDS in Equivalents | 0 | 0.4 | 0.6 |
| Temperature [° C.] | 55 | 55 | 55 |
| Cu thickness [µm] | 3.34 | 3.67 | 4.09 |

A combination of EDDS/EDTA (table 1, FIG. 1 left) leads to increased copper thicknesses in comparison to EDTA alone, when the same process time is chosen. Copper thickness can be increased by a factor of approximately 3, from 0.5 µm (no EDDS) to 1.47 µm (6.8 g/l EDDS).

A combination of EDDS/HEDTA (table 3, FIG. 1 middle) leads to increased copper thicknesses in comparison to HEDTA alone, when the same process time is chosen. Copper thickness can be increased by a factor of approximately 2.4, from 1.31 µm (no EDDS) to 3.18 µm (6.8 g/l EDDS).

Less strong influence on copper thickness is observed when increased amounts of EDDS, as only complexing agent, are employed (FIG. 1, right side; table 4). 28.4 g/l EDDS are employed as basic amount and amounts of 0 g/l, 4.5 g/l and 6.8 g/l were added, as in the other examples.

Copper thickness is increased by a factor of approximately 1.2 only, from 3.34 μm (0 g/l additional EDDS) to 4.09 μm (6.8 g/l additional EDDS).

EXAMPLE 2

Combination of Polyamino Disuccinic Acid with Two Further Complexing Agents (HEDTA and Quadrol)

The same substrates, pre-treatment procedures, components of the bath and pH were used as in Example 1. As complexing agents EDDS, HEDTA and N,N,N',N'-Tetrakis (2-hydroxypropyl)ethylenediamine were used. N,N,N',N'-Tetrakis(2-hydroxypropyl)ethylenediamine is hereinafter abbreviated as "Quadrol", which is a trademark of BASF company.

Deposition rate was determined from the thickness of copper layer, determined with white light interferometry, and the deposition time.

Figure 2A:
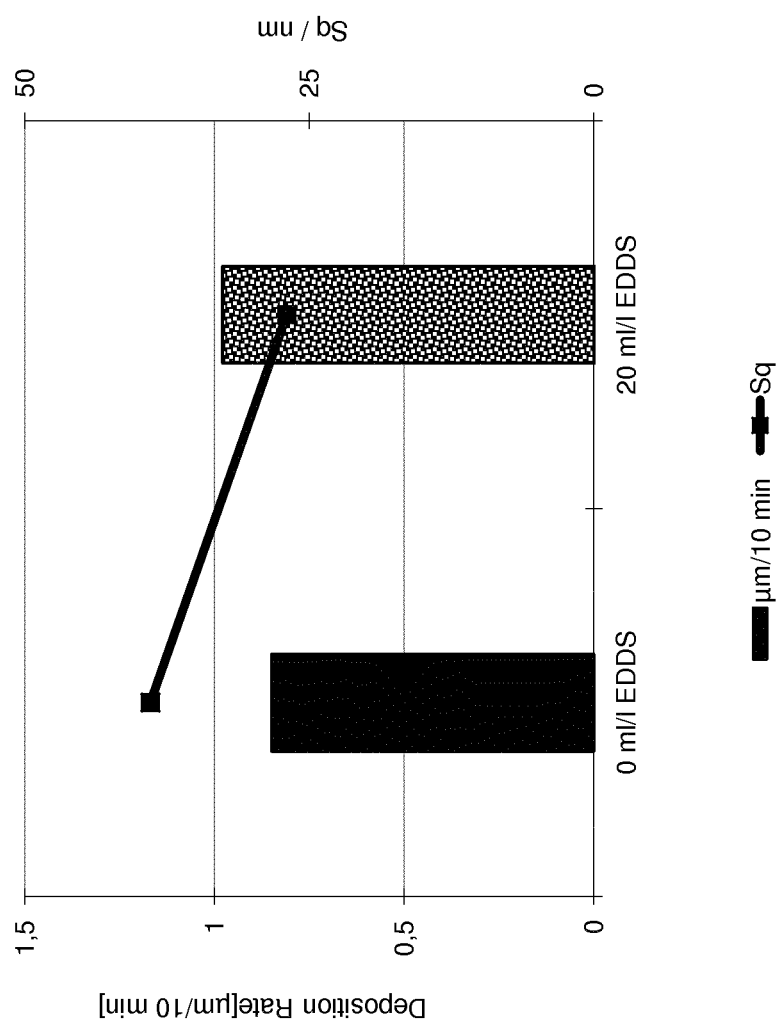
Figure 2B:
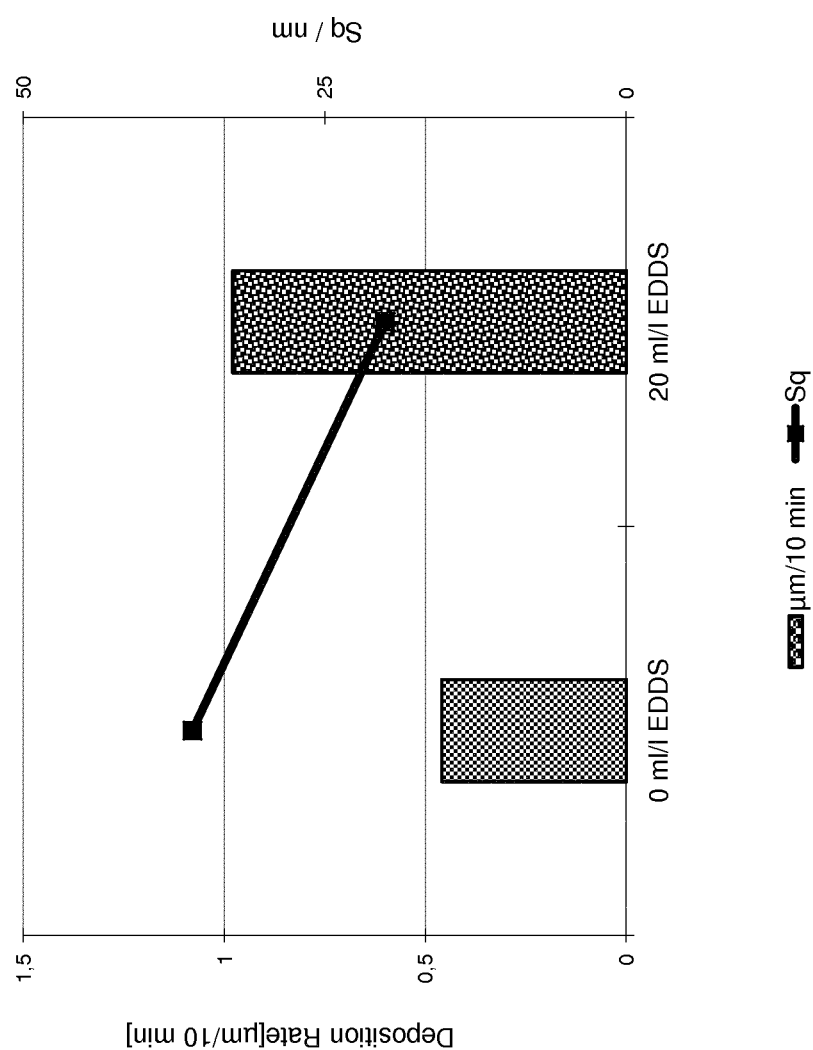
Figure 2C:
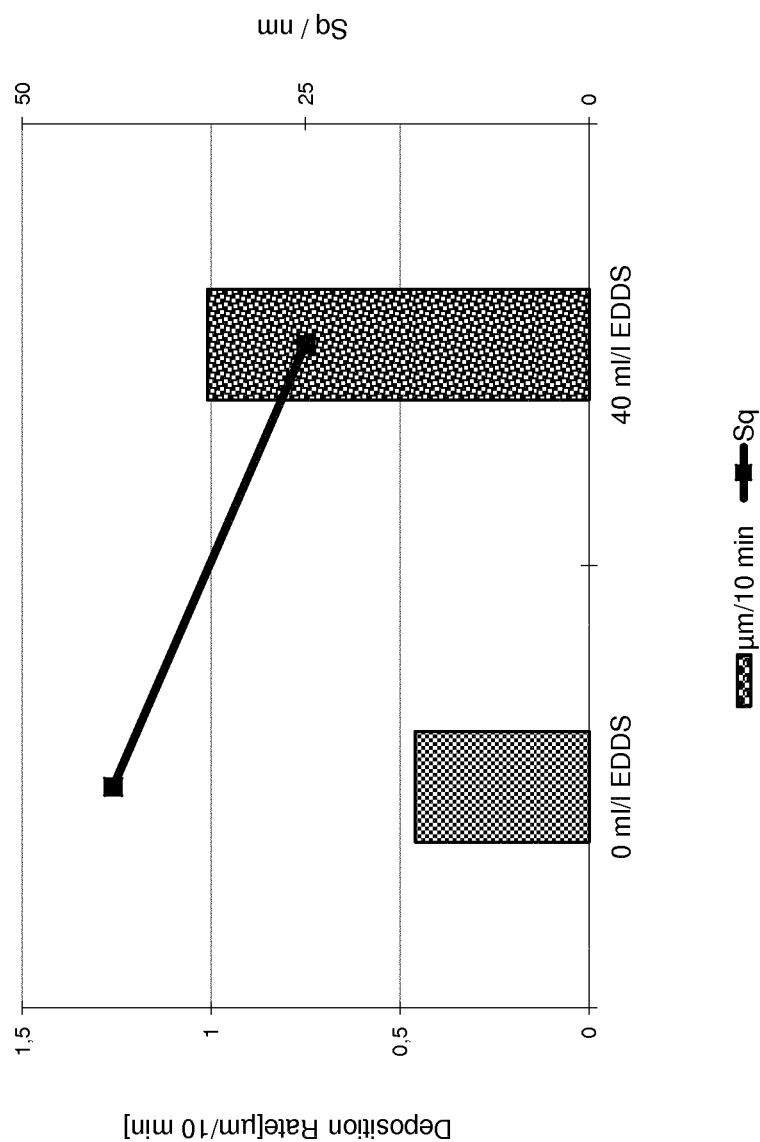

The experimental set-up and results are shown in table 5. In experiment No. 1, 2 and 3, different amounts glyoxylic acid were employed. The results as to deposition rate and roughness (Sq) are also shown in FIG. 2a (experiments No. 1A and 1B from table 5), FIG. 2b (experiments No. 2A and 2B from table 5) and FIG. 2c (experiments No. 3A and 3B from table 5). Dwell time means the time of contacting the substrates with the electroless copper plating solutions.

The results show that addition of EDDS increases deposition rate and reduces at the same time roughness of the deposited copper layers.

agents on deposition rate. Addition of EDDS to the mixture of complexing agents HEDTA and Quadrol leads to an increase in deposition rate (experiment No. 6). As shown in the comparative example 3.3 below, further addition of HEDTA/Quadrol does not lead to an increase in deposition rate.

TABLE 6

Beaker Test

| | 0 ml/l EDDS | 0 ml/l EDDS | 65 ml/l EDDS |
|---|---|---|---|
| | Experiment Name | | |
| | 4 | 5 | 6 |
| HEDTA | 32.1 g/l | 32.1 g/l | 32.1 g/l |
| HEDTA in Equivalents | 2.9 | 2.9 | 2.9 |
| Quadrol | 2.3 g/l | 2.3 g/l | 2.3 g/l |
| Quadrol in Equivalents | 0.2 | 0.2 | 0.2 |
| $Cu^{2+}$ | 2.5 g/l | 2.5 g/l | 2.5 g/l |
| $H_2PO_2^-$ | 9.1 g/l | 9.1 g/l | 9.1 g/l |
| KOH | 10 g/l | 10 g/l | 10 g/l |
| Glyoxylic Acid | 4.5 g/l | 4.5 g/l | 4.5 g/l |
| Stabilizer | 10 mg/l | 10 mg/l | 10 mg/l |
| EDDS | 0 g/l | 0 g/l | 23.3 g/l |
| EDDS in Equivalents | 0 | 0 | 2.0 |
| Temperature [° C.] | 55 | 55 | 55 |
| Cu Deposition Rate [μm/10 min] | 0.55 | 0.43 | 1.17 |

TABLE 5

Combination of polyamino disuccinic acid with two further complexing agents (HEDTA and Quadrol)

| No. | EDDS Content | Cu Thickness [μm] | Sq [nm] | Dwell Time [min] | deposition rate [μm/10 min] | $Cu^{2+}$ [g/l] | Glyoxylic Acid [g/l] | KOH [g/l] | $H_2PO_2^-$ [g/l] | HEDTA [g/l] | Quadrol [g/l] | Stabilizer [mg/l] | T [° C.] |
|---|---|---|---|---|---|---|---|---|---|---|---|---|---|
| 1A | 0 ml/l | 1.88 | 39 | 22 | 0.85 | 2.5 | 3.4 | 8 | 9.1 | 32.1 | 1.7 | 10 | 52 |
| 1B | 20 ml/l = 4.5 g/l = 0.4 Eq | 1.96 | 27 | 20 | 0.98 | 2.5 | 3.4 | 8 | 9.1 | 32.1 | 1.7 | 10 | 50 |
| 2A | 0 ml/l | 1.02 | 36 | 22 | 0.46 | 2.5 | 4.5 | 10 | 9.1 | 32.1 | 1.7 | 10 | 55 |
| 2B | 20 ml/l = 4.5 g/l = 0.4 Eq | 0.98 | 20 | 10 | 0.98 | 2.5 | 3.4 | 8 | 9.1 | 32.1 | 1.7 | 10 | 50 |
| 3A | 0 ml/l | 1.01 | 42 | 22 | 0.46 | 2.5 | 4.5 | 10 | 9.1 | 32.1 | 1.7 | 10 | 55 |
| 3B | 40 ml/l = 9.1 g/l = 0.8 Eq | 0.96 | 25 | 9.5 | 1.01 | 2.5 | 4.2 | 8 | 9.1 | 32.1 | 1.7 | 10 | 49 |
| | | | | | | | | | | 2.9 Eq | 0.15 Eq | | |

Eq = Equivalent

EXAMPLE 3

Combination of Polyamino Disuccinic Acid with Two Further Complexing Agents (HEDTA and Quadrol)

The same substrates, pre-treatment procedures, components of the bath and pH were used as in Example 1

3.1 Beaker Test

Experiments were done in a beaker. In Table 6, bath compositions and results of experiments are shown.

Figure 3:
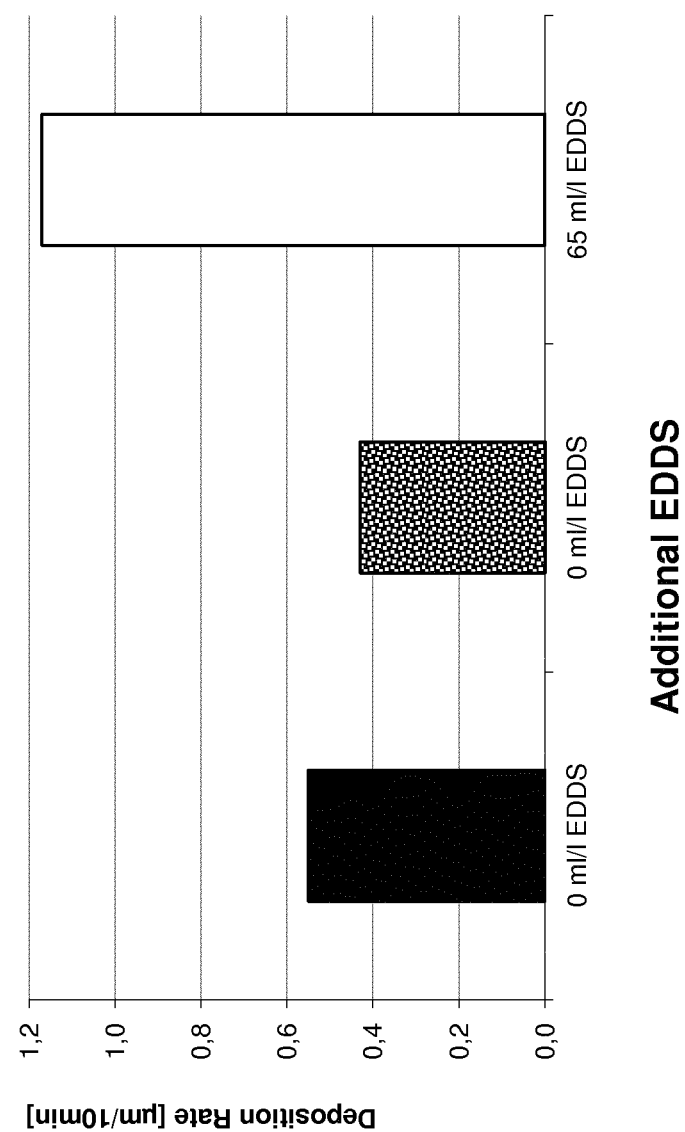

In experiments No. 4 and No. 5 three equivalents HEDTA/Quadrol per equivalent copper were used. In experiment No. 6 two equivalents EDDS per equivalent copper were added. FIG. 3 shows the effect of complexing 3.2 Horizontal Line Tests Experiments were done in a Horizontal conveyorized equipment. In Table 7, bath compositions and results of experiments are shown.

Figure 4:
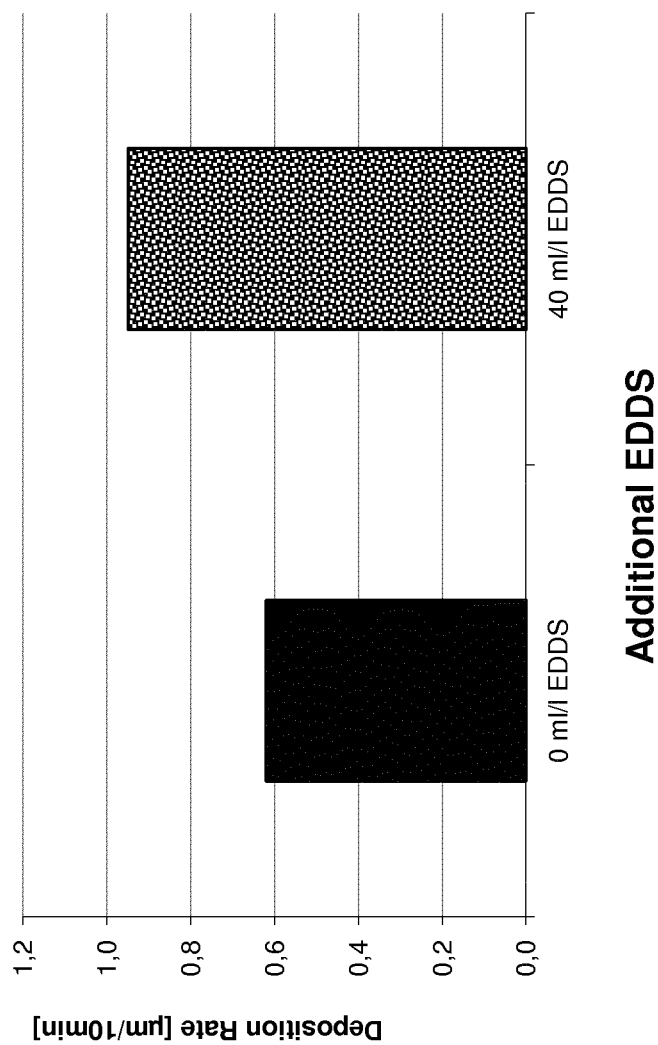

In experiment No. 7 three equivalents HEDTA/Quadrol per equivalent copper were used. In experiment No. 8, EDDS was added as additional complexing agent. FIG. 4 shows the effect of complexing agents on deposition rate. Addition of EDDS to the mixture of complexing agents HEDTA and Quadrol leads to an increase in deposition rate. As shown in the comparative example 3.3 below, further addition of HEDTA/Quadrol does not lead to an increase in deposition rate.

TABLE 7

| | Horizontal Line setup | |
|---|---|---|
| | 0 ml/l EDDS | 40 ml/l EDDS |
| Experiment Name | 7 | 8 |
| HEDTA | 32.1 g/l | 32.1 g/l |
| HEDTA in Equivalents | 2.9 | 2.9 |
| Quadrol | 2.3 g/l | 2.3 g/l |
| Quadrol in Equivalents | 0.2 | 0.2 |
| $Cu^{2+}$ | 2.5 g/l | 2.5 g/l |
| $H_2PO_2^-$ | 9.1 g/l | 9.1 g/l |
| KOH | 10 g/l | 10 g/l |
| Glyoxylic Acid | 4.5 g/l | 4.5 g/l |
| Stabilizer | 10 mg/l | 10 mg/l |
| EDDS | 0 g/l | 14.3 g/l |
| EDDS in Equivalents | 0 | 1.2 |
| Temperature [° C.] | 55 | 55 |
| Average Cu Deposition Rate [μm/10 min] | 0.62 | 0.95 |

3.3 Comparative Example, HEDTA and Quadrol Only

Experiments were done in a Horizontal Line setup. In Table 8, bath compositions and results of experiments are shown.

In experiments No. 9 and No. 10, three equivalents HEDTA/Quadrol per equivalent copper were used.

Starting in experiment No. 11, increasing amounts of further HEDTA and Quadrol were added, up to six equivalents HEDTA/Quadrol per equivalent copper in total (experiment No. 16).

Figure 5:
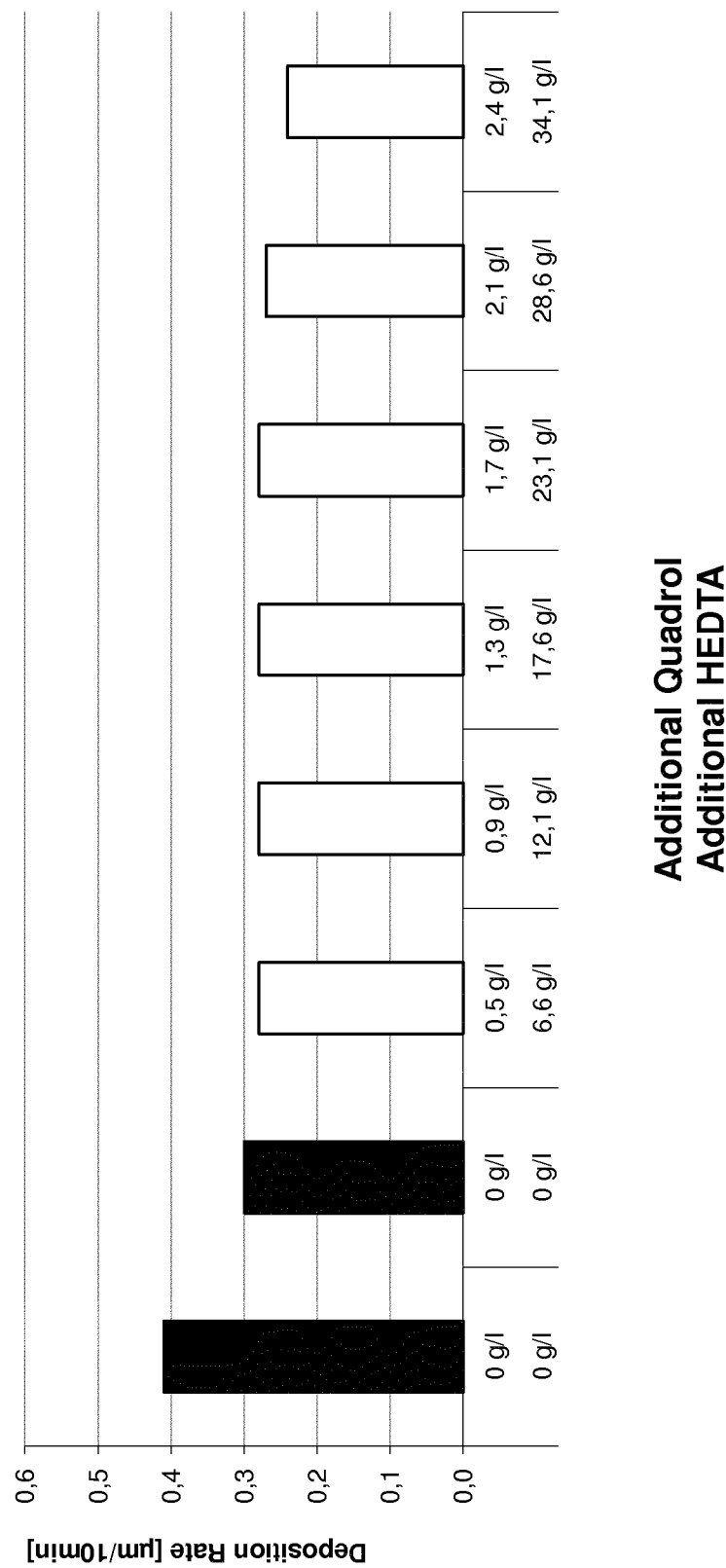

FIG. 5 shows the effect of complexing agents on deposition rate. As can be seen from the results, an increase of HEDTA/Quadrol concentration does not lead to increased deposition rate. On the contrary, a trend to lower deposition rates can be observed, when further HEDTA/Quadrol is added.

TABLE 8

| | Horizontal Line setup | | | | | | | |
|---|---|---|---|---|---|---|---|---|
| Experiment Name | 9 | 10 | 11 | 12 | 13 | 14 | 15 | 16 |
| HEDTA | 32.1 g/l | 32.1 g/l | 32.1 g/l | 32.1 g/l | 32.1 g/l | 32.1 g/l | 32.1 g/l | 32.1 g/l |
| Quadrol | 2.3 g/l | 2.3 g/l | 2.3 g/l | 2.3 g/l | 2.3 g/l | 2.3 g/l | 2.3 g/l | 2.3 g/l |
| $Cu^{2+}$ | 2.5 g/l | 2.5 g/l | 2.5 g/l | 2.5 g/l | 2.5 g/l | 2.5 g/l | 2.5 g/l | 2.5 g/l |
| $H_2PO_2^-$ | 9.1 g/l | 9.1 g/l | 9.1 g/l | 9.1 g/l | 9.1 g/l | 9.1 g/l | 9.1 g/l | 9.1 g/l |
| KOH | 10 g/l | 10 g/l | 10 g/l | 10 g/l | 10 g/l | 10 g/l | 10 g/l | 10 g/l |
| Glyoxylic Acid | 4.5 g/l | 4.5 g/l | 4.5 g/l | 4.5 g/l | 4.5 g/l | 4.5 g/l | 4.5 g/l | 4.5 g/l |
| Stabilizer | 10 mg/l | 10 mg/l | 10 mg/l | 10 mg/l | 10 mg/l | 10 mg/l | 10 mg/l | 10 mg/l |
| HEDTA (additional) | 0 g/l | 0 g/l | 6.6 g/l | 12.1 g/l | 17.6 g/l | 23.1 g/l | 28.6 g/l | 34.1 g/l |
| Quadrol (additional) | 0 g/l | 0 g/l | 0.5 g/l | 0.9 g/l | 1.3 g/l | 1.7 g/l | 2.1 g/l | 2.4 g/l |
| Temperature [° C.] | 55 | 55 | 55 | 55 | 55 | 55 | 55 | 55 |
| Cu Deposition Rate [μm/10 min] | 0.41 | 0.30 | 0.28 | 0.28 | 0.28 | 0.28 | 0.27 | 0.24 |

EXAMPLE 4

Variation of the Ratio of Two Complexing Agents (EDDS and HEDTA)

Experiments were conducted as in Example 1.

TABLE 9

| Ratio of total complexing agents to Cu (i + ii):Cu | Ratio of complexing agents (i EDDS):(ii HEDTA) |
|---|---|
| 3.1:1 | 1:31 |
| 3.1:1 | 1:8 |
| 3.1:1 | 1:4 |
| 3.1:1 | 1:0.05 |

| Bath composition | |
|---|---|
| $Cu^{2+}$ | 2.5 g/l |
| KOH | 8 g/l |
| Stabilizer | 2 mg/l |
| glyoxylic acid | 4.6 g/l |
| temperature | 45° C. |

Deposition time: 10 min

Further details of experiments and results are given in table 10.

TABLE 10

| ratio of EDDS:HEDTA | Complexing agents:Cu | Seed Layer [μm] | Cu Thickness [μm] average | standard deviation | Roughness Sq [nm] average | Comment |
|---|---|---|---|---|---|---|
| 1:31 | 3.1:1 | 0.344 | 0.196 | 0.01 | 7 | |
| 1:8 | 3.1:1 | 0.344 | 0.264 | 0.01 | 8 | |
| 1:4 | 3.1:1 | 0.344 | 0.266 | 0.04 | 8 | |
| 1:0.05 | 3.1:1 | 0.344 | 0.081 | 0.05 | 42 | inhomogenous deposit |
| 1:4 | 0.5:1 | 0.344 | −0.001 | 0.01 | 6 | bath was close to instable, $H_2$ formation |
| 1:4 | 3.1:1 | 0.344 | 0.266 | 0.04 | 8 | |
| 1:4 | 11:1 | 0.344 | 0.921 | 0.06 | 54 | bath was close to instable, $H_2$ formation, wild growth |

Figure 6:
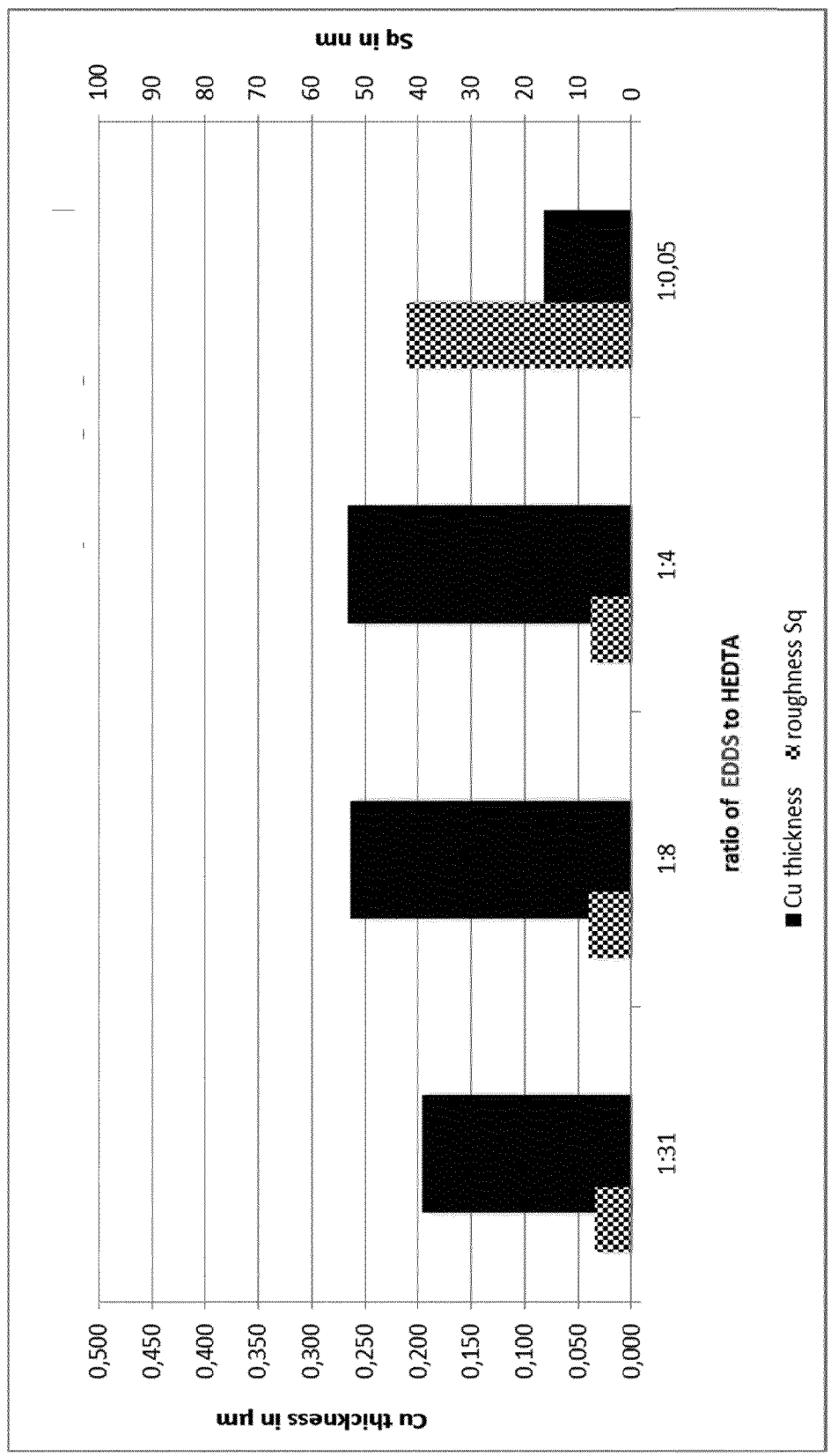

The results of the variation of the ratio of two complexing agents (EDDS and HEDTA) are shown in FIG. 6. Highest copper thickness is reached at ratio EDDS to HEDTA of 1:8 and 1:4. At ratio of 1:0.05 thickness of copper decreases strongly and roughness increases strongly.

EXAMPLE 5

Variation of the Ratio of Copper to Total Complexing Agents (EDDS and HEDTA)

Experiments were conducted as in Example 1.

TABLE 11

| Ratio of total complexing agents to Cu (i + ii):Cu | Ratio of complexing agents (i EDDS):(ii HEDTA) |
|---|---|
| 0.5:1 | 1:4 |
| 3.1:1 | 1:4 |
| 11:1 | 1:4 |

| Bath composition | |
|---|---|
| $Cu^{2+}$ | 2.5 g/l |
| KOH | 8 g/l |
| Stabilizer | 2 mg/l |
| glyoxylic acid | 4.6 g/l |
| temperature | 45° C. |

Deposition time: 10 min

Further details of experiments and results are given in table 10.

Figure 7:
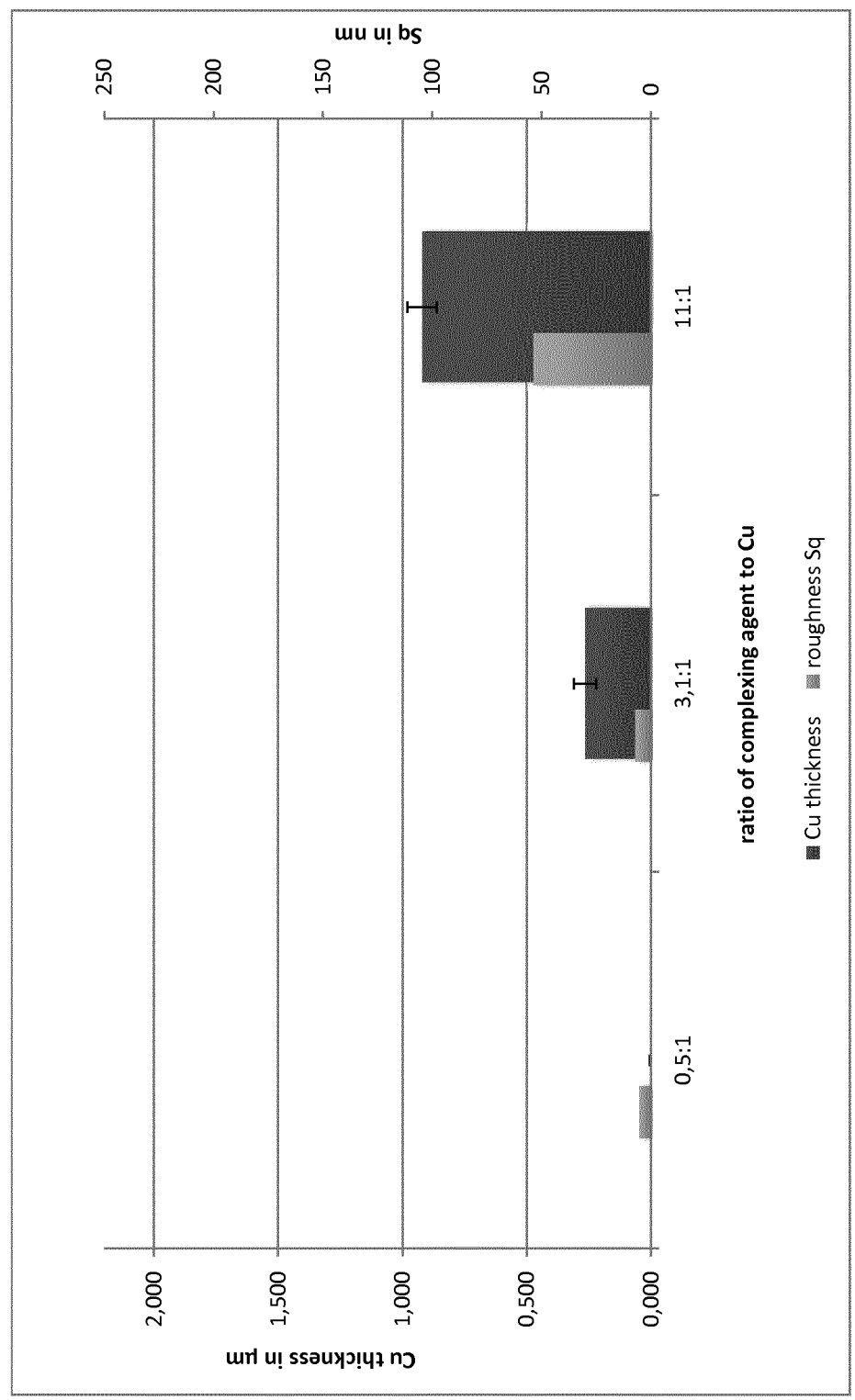

The results of the variation of the ratio of copper to total complexing agents (EDDS and HEDTA) are shown in FIG. 7. Copper thickness but also roughness increase with increasing ratio of total complexing agents to copper. Copper Baths with a ratio of total complexing agents to Cu of 0.5:1- and 11:1 were unstable, the bath with a ratio of 3.1:1 was stable.

The invention claimed is:

1. An electroless aqueous copper plating solution comprising:
   a source of copper ions;
   a reducing agent or a source of a reducing agent; and
   a combination of complexing agents, the combination comprising:
   i) polyamino disuccinic acid, polyamino monosuccinic acid, or combinations thereof, and
   ii) one or more of a compound which is selected from the group consisting of ethylenediamine tetraacetic acid, N'-(2-Hydroxyethyl)-ethylenediamine-N,N,N'-triacetic acid, and N,N,N',N'-Tetrakis (2-hydroxypropyl)ethylenediamine.

2. The electroless aqueous copper plating solution according to claim 1, wherein the combination of complexing agents comprises:
   N'-(2-Hydroxyethyl)-ethylenediamine-N,N,N'-triacetic acid and
   N,N,N',N'-Tetrakis (2-hydroxypropyl)ethylenediamine.

3. The electroless aqueous copper plating solution according to claim 1, wherein the combination of complexing agents comprises polyamino disuccinic acid.

4. The electroless aqueous copper plating solution according to claim 1, wherein the combination of complexing agents comprises ethylenediaminedisuccinic acid.

5. The electroless aqueous copper plating solution according to claim 1, wherein the molar ratio of the combination of complexing agents to copper ions is in the range of 1:1 to 10:1.

6. The electroless aqueous copper plating solution according to claim 1, wherein the reducing agent is one or more of glyoxylic acid and formaldehyde.

7. The electroless aqueous copper plating solution according to claim 1, wherein the solution further comprises a stabilizing agent.

8. The electroless aqueous copper plating solution according to claim 7, wherein the stabilizing agent is a dipyridyl, phenanthroline, mercapto-benzothiazole, thio-urea or derivative, cyanide, thiocyanate, iodide, ethanolamine, or a polymer.

9. The electroless aqueous copper plating solution according to claim 1, wherein the solution further comprises a source of hydroxide ions.

10. A method for electroless copper plating, the method comprising contacting a substrate with an electroless copper plating solution according to claim 1.

11. The method according to claim 10, wherein the substrate is made from glass, ceramic or plastics.

12. The method according to claim 10, wherein the substrate is glass.

13. The method according to claim 10, wherein a copper layer having a roughness of 5-40 nm, expressed as root-mean-square roughness parameter (RMS), is formed on the substrate.

14. A method of plating a printed circuit board, integrated circuit substrate, wafer, molded interconnect device, display, display component or plastic part comprising contacting the printed circuit boards, integrated circuit substrates, wafers, molded interconnect devices, displays, display components or plastic parts with the electroless copper plating solution according to claim 1.

15. A method of plating a glass substrate comprising contacting the glass substrates with the electroless copper plating solution according to claim 1.

16. The method according to claim 10, wherein the substrate has a surface area of at least 1 m$^2$.

17. The method according to claim 12, wherein the substrate is a glass panel.

18. The method according to claim 15, wherein the glass substrate is a glass panel for display.

19. The electroless aqueous copper plating solution according to claim 8, wherein the polymer is a polyacrylamide, polyacrylate, polyethylene glycol, polypropylene glycol, or co-polymer of any of the foregoing.

* * * * *